(12) United States Patent
Yang (10) Patent No.: US 9,188,883 B2
(45) Date of Patent: Nov. 17, 2015

(54) ALIGNMENT MARK

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 425 days.

(21) Appl. No.: 11/873,265

(22) Filed: Oct. 16, 2007

(65) Prior Publication Data

US 2009/0096116 A1    Apr. 16, 2009

(51) Int. Cl.
*H01L 23/544* (2006.01)
*G03F 9/00* (2006.01)

(52) U.S. Cl.
CPC .............. *G03F 9/7084* (2013.01); *G03F 9/708* (2013.01); *G03F 9/7076* (2013.01); *H01L 23/544* (2013.01); *H01L 2223/5446* (2013.01); *H01L 2223/54426* (2013.01); *H01L 2223/54453* (2013.01); *H01L 2924/0002* (2013.01)

(58) Field of Classification Search
CPC .... H01L 23/544; G03F 9/7076; G03F 9/7084
USPC ................................... 257/797; 438/401, 462
See application file for complete search history.

(56) References Cited

U.S. PATENT DOCUMENTS

| 6,043,133 | A  |   | 3/2000  | Jang et al.      |         |
|-----------|----|---|---------|------------------|---------|
| 6,274,940 | B1 | * | 8/2001  | Baker et al.     | 257/797 |
| 6,440,816 | B1 |   | 8/2002  | Farrow et al.    |         |
| 6,979,526 | B2 |   | 12/2005 | Ning             |         |
| 2005/0070068 | A1 | * | 3/2005  | Kobayashi     | 438/401 |
| 2007/0023932 | A1 | * | 2/2007  | Sogawa et al. | 257/797 |

FOREIGN PATENT DOCUMENTS

TW                548787              8/2003

* cited by examiner

*Primary Examiner* — Allison P Bernstein
(74) *Attorney, Agent, or Firm* — J.C. Patents (57) ABSTRACT

The invention is directed to an alignment mark in a material layer in an alignment region of a wafer. The alignment mark comprises a plurality of sub-marks. Each of the sub-mark comprises a first element and a plurality of second elements. The second elements are embedded in the first element and a first top surface of the first element is at the same height as a second top surface of each of the second elements.

7 Claims, 7 Drawing Sheets

ALIGNMENT MARK

BACKGROUND OF THE INVENTION

1. Field of Invention

The present invention relates to an alignment mark and a method for forming the same. More particularly, the present invention relates to an alignment mark with a relatively high contrast under an optical tool and a method for forming the same.

2. Description of Related Art

In the manufacture of integrated circuit, photolithography process is used to transfer patterns from a photo mask having customized circuit patterns to thin films formed on a wafer. The image transfer process comprises steps of forming a photoresist layer on a non-process layer, illuminating the photoresist layer through a photo mask having the customized circuit patterns, developing the photoresist layer and then etching the non-process layer by using the patterned photoresist layer as a mask. Hence, the image transfer process is accomplished. For a well-manufactured integrated circuit product, the image transfer process mentioned above is performed several times to transfer the circuit patterns to each non-process layers to form the electrically circuit device.

Figure 1A:
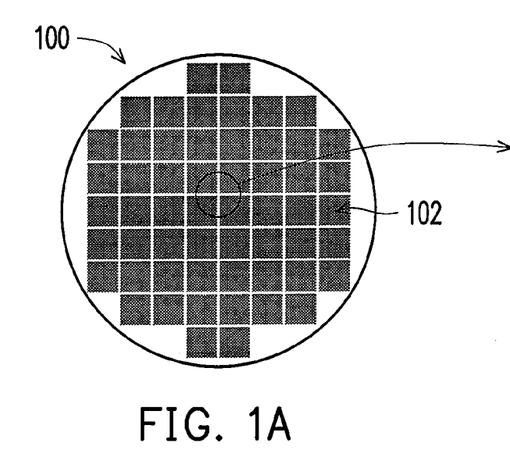
FIG. 1A is a top view showing a wafer with a plurality of device regions thereon.
Figure 1B:
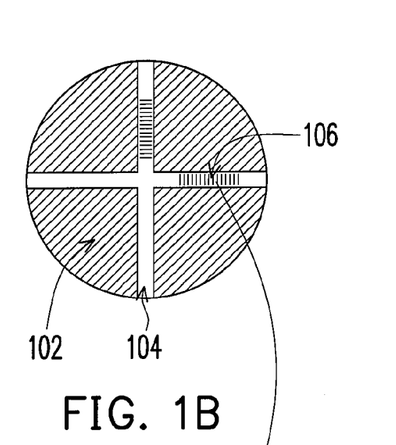
FIG. 1B is an enlarge view of a portion of FIG. 1A for illustrating one of the alignment regions of the wafer shown in FIG. 1A.
Figure 1C:
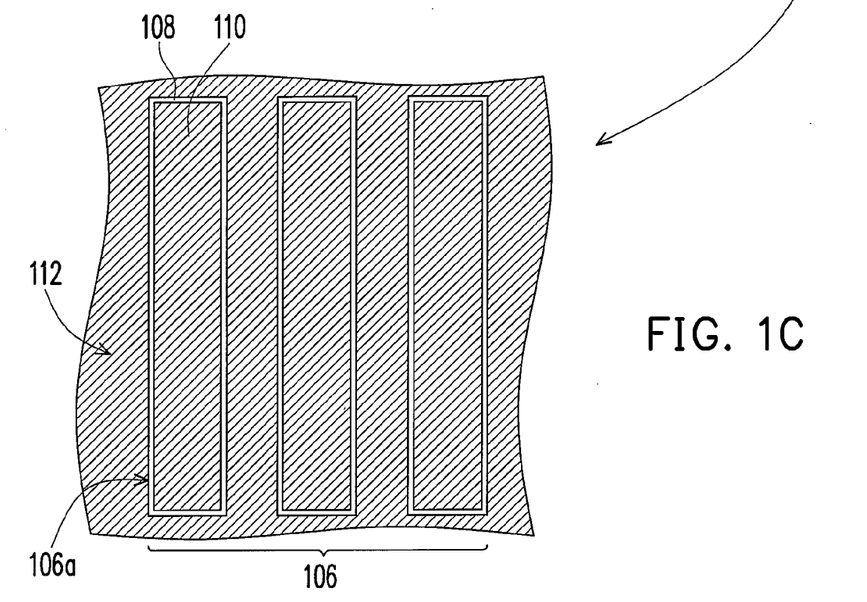
FIG. 1C is an enlarge view of the alignment region shown in FIG. 1B.
Figure 1D:
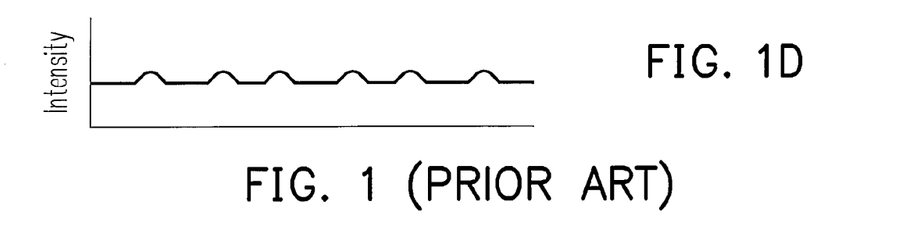
FIG. 1D is a spectrum showing an image contrast of the conventional alignment mark shown in FIG. 1C.

During the photolithography process for transferring the pattern from photo mask to the target material layer, it is necessary for the exposure tool to position the wafer on the station by referring the alignment mark on the wafer. FIG. 1 is a diagram schematically illustrating a conventional alignment mark. FIG. 1A is a top view showing a wafer with a plurality of device regions thereon. FIG. 1B is an enlarge view of a portion of FIG. 1A for illustrating one of the alignment regions of the wafer shown in FIG. 1A. As shown in FIG. 1A together with FIG. 1B, conventionally, in order to achieve proper alignment, at least one alignment mark 106 is formed at the alignment region 104 aside the device region 102 on the wafer 100. FIG. 1C is an enlarge view of the alignment region shown in FIG. 1B. FIG. 1D is a spectrum showing an image contrast of the conventional alignment mark shown in FIG. 1C. As shown in FIG. 1C, for each alignment mark 106, there are several sub-marks 106a. Each sub-mark 106a composed of a fine frame 108 and an alignment component 110 which is enclosed by the fine frame 108. Conventionally, the size of the fine frame 108 is smaller than or equal to the size of the spacer (not shown) formed on the device element (not shown) in the device region 102 at the same material level of the fine frame 108. Hence, the surface area of fine frame 108 is only about 0.1% of the sub-mark 106a for single sub-mark 106a. Therefore, as shown in FIG. 1D together with FIG. 1C, the fine frame 108 contributes to a very low the image contrast according to the background material layer 112. That is, it is hardly recognize the fine frame 108 for the alignment tool to position the wafer. Therefore, the alignment preciseness for later performed photolithography process is poor.

SUMMARY OF THE INVENTION

Accordingly, the present invention is to provide an alignment mark for enhancing the image contrast between the alignment mark and the background material layer.

The present invention also provides a method for forming an alignment mark capable of improving the alignment preciseness.

To achieve these and other advantages and in accordance with the purpose of the invention, as embodied and broadly described herein, the invention provides an alignment mark in a material layer in an alignment region of a wafer. The alignment mark comprises a plurality of sub-marks. Each of the sub-mark comprises a first element and a plurality of second elements. The second elements are embedded in the first element and a first top surface of the first element is at the same height as a second top surface of each of the second elements.

According to one embodiment of the present invention, the distance between the second elements is about 1~2 times of a thickness of a sidewall spacer. Furthermore, the pitch of the second elements embedded in the first element is about 2~4 times of an array pitch. Also, the previously mentioned array pitch includes a pitch of an array of the material layer in a device region of the wafer. Moreover, the aforementioned sidewall spacer includes a gate spacer on a device of the material layer in a device region of the wafer.

According to one embodiment of the present invention, the distance between the second elements is about 2.5~3.5 times of a thickness of a sidewall spacer. Also, the pitch of the second elements embedded in the first element is about 2.5~5 times of an array pitch. The array pitch mentioned above includes a pitch of an array of the material layer in a device region of the wafer. Further, the aforementioned sidewall spacer includes a gate spacer of a device of the material layer in a device region of the wafer.

According to one embodiment of the present invention, the second elements are made of a material as same as the material layer.

According to one embodiment of the present invention, a first material of the first element is different from a second material of the second elements.

According to one embodiment of the present invention, for each sub-mark, a total surface area of the first element is 20%~60% of a total surface area of the sub-mark.

The present invention also provides a semiconductor process which is performed on a wafer, wherein the wafer includes at least a device region and at least an alignment region. The method comprises steps of forming a first material layer over the wafer. A photolithography process is performed to pattern the first material layer so that a portion of the first material layer in the device region is transformed into a plurality of device elements and a plurality of trench patterns is formed in a portion of the first material layer in the alignment region. Thus, each trench pattern encloses a plurality of island elements made of the first material layer. Moreover, a second material layer is formed over the first material layer so as to form a spacer on a sidewall of each of the device elements and fill the trench patterns. Therefore, the filled trench patterns and the island elements are defined as an alignment mark and each of the filled trench pattern and the island elements enclosed therein are defined as a sub-mark of the alignment mark.

According to one embodiment of the present invention, the distance between the island elements is about 1~2 times of a thickness of the spacer. Further, the pitch of the island elements embedded in the first element is about ~2~4 times of the pitch of the device elements. Also, the distance between the island elements is about 2.5~3.5 times of a thickness of the spacer. The aforementioned pitch of the island elements is about 2.5~5 times of a pitch of the device elements.

According to one embodiment of the present invention, the device elements include gate strips.

According to one embodiment of the present invention, the method further comprises steps of forming a third material layer over the wafer so as to fill gaps between the device elements. A planarization process is performed so that the top surface of each device element in the device region is exposed and the top surface of a portion of the second material layer and a top surface of a portion of the first material layer in the alignment region are exposed as well.

According to one embodiment of the present invention, for each sub-mark, a total surface area of the second material layer is 20%~60% of a total surface area of the sub-mark.

In the present invention, the alignment mark constructed by at least two different materials and the surface ratio of two materials of the alignment mark is approach to 1. Therefore, the image contrast provided by the alignment mark is sharp and the alignment between the exposure tool used in later performed photolithography process and the wafer is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 1 is a diagram schematically illustrating a conventional alignment mark.

DESCRIPTION OF THE PREFERRED EMBODIMENTS

Figure 2A:
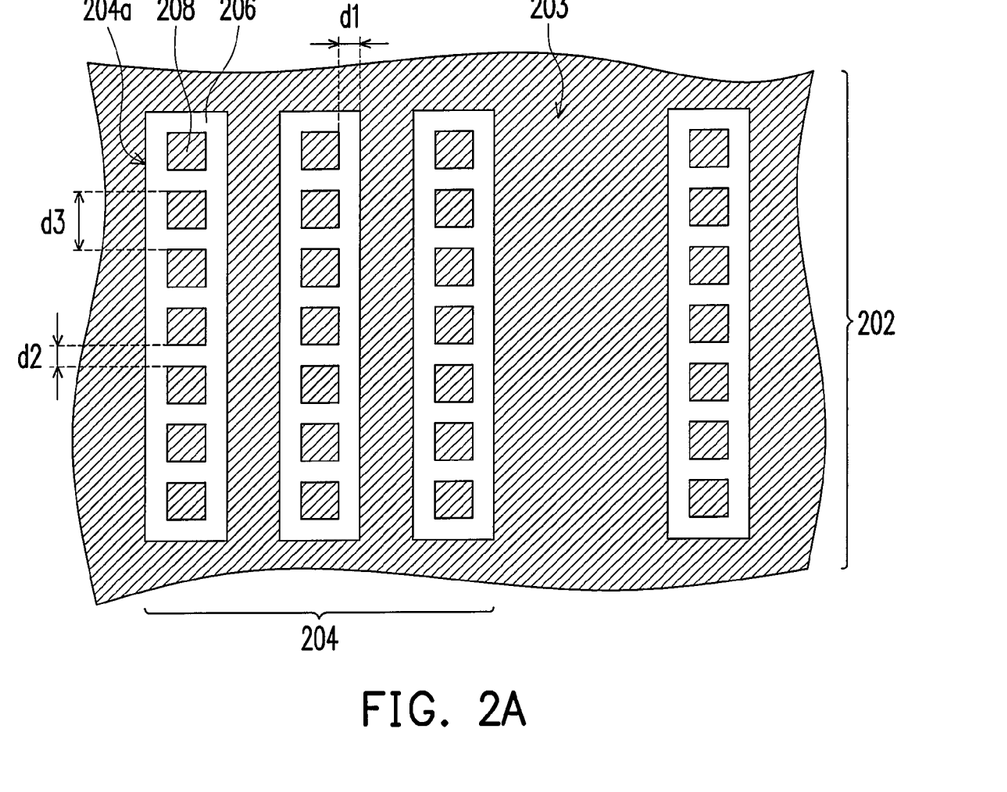
FIG. 2A is a top view schematically illustrating an alignment mark in an alignment region of a wafer according to one embodiment of the present invention.
Figure 2B:
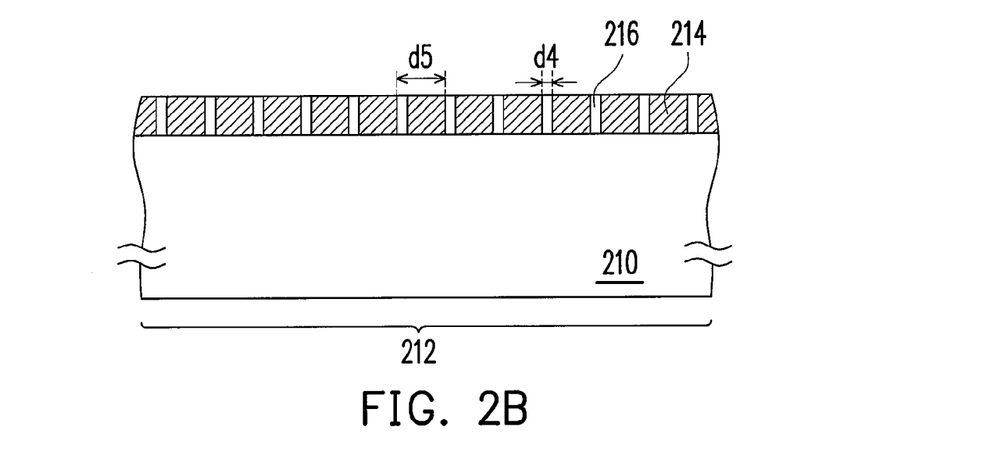
FIG. 2B is a cross-sectional view schematically illustrating a device region of the wafer in FIG. 2A.

FIG. 2A is a top view schematically illustrating an alignment mark in an alignment region of a wafer according to one embodiment of the present invention. FIG. 2B is a cross-sectional view schematically illustrating a device region of the wafer in FIG. 2A. As shown in FIG. 2A together with FIG. 2B, in an alignment region 202 of a material layer 203 over a wafer 210, there are alignment marks 204. Each of the alignment mark 204 has several sub-marks 204a. In the present embodiment, one alignment mark 204 possesses three sub-marks 204a. However, the invention is not limited to the numbers of the sub-marks mentioned above. It should be noticed that each of the sub-mark 204a comprises a first element 206 and several second elements 208. The second elements 208 are embedded in the first element 206. Furthermore, the top surface of the first element 206 is at the same height as the top surfaces of the second elements 208.

Meanwhile, in a device region 212 of the wafer 210, there are several device element 214 made of the material layer 203. In the present embodiment, the device elements 214 can be, for example but not limited to, gate strips. In this embodiment, the material layer 203 can be, for example but not limited to, made of polysilicon or the material practically used for forming the gate in the industrial field. On the other words, the device element 214, made from the material layer 203, is made of polysilicon or the material practically used for forming the gate in the industrial field. In addition, the gate strips in the present embodiment together form a device array. Each of the device elements 214 has a device spacer 216, such as gate spacer, formed on the sidewall thereof. Hence, the material for forming the device spacer 216 can be, for example but not limited to, silicon oxide, silicon nitride, silicon oxynitride or other proper insulating material. It should be noticed that the device spacers 216 can be, for example but not limited to, made of the material as same as that of the first element 206 in the sub-mark 204a. Under the circumstance mentioned above, the first element 206 of each sub-mark 204a is formed in the alignment region 202 at the time the device spacers 216 are formed on the sidewall of the device elements 214 respectively in the device region 212. That is, the device spacers 216 and the first element 206 of each sub-mark 204a are formed at the same process step. Moreover, the second elements 208 can be, for example but not limited to, made of a material as same as the material layer 203. In addition, the material of the first element 206 is different from the material of the second elements 208. That is, the material of the first element 206 is different form the material layer 203.

Further, the shortest distance d1 between the second elements 208 and the outer edge of the first element 206 can be, for example but not limited to, about 1~2 times of the thickness d4 of the device spacer 216. Also, the distance d2 between the second elements 208 can be, for example but not limited to, about 1~2 times of the thickness d4 of the device spacer 216. Further, when each of the distances d1 and d2 is about 1~2 times of the thickness of the device spacer 216 in the device region 212, a pitch d3 of the second elements 208 embedded in the first element 206 can be, for example but not limited to, about 2~4 times of the pitch d5 of the device array formed from device elements 214.

Figure 2C:
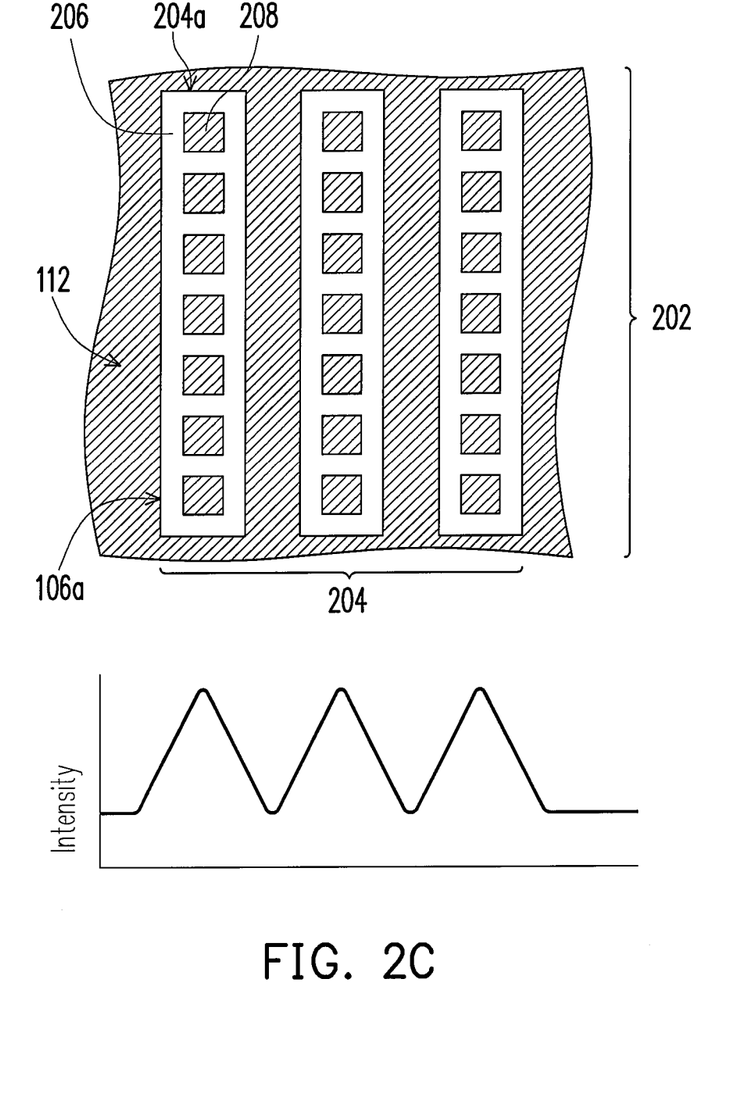
FIG. 2C is a spectrum showing an image contrast between the sub-mark and the background according to one embodiment of the present invention.

Accordingly, in the present invention, for each sub-mark 204a, the total surface area of the first element is about 20%~60% of a total surface area of the sub-mark. FIG. 2C is a spectrum showing an image contrast between the sub-mark and the background according to one embodiment of the present invention. As shown in FIG. 2C, since the total surface area of the first element is about 20%~60% of a total surface area of the sub-mark for each sub-mark 204a, the image contrast between the sub-mark 204a and the background, which is the material layer 203 in the alignment region 202, is sharp/intense. Thus, during the later performed photolithography process, the exposure tool can easily position the wafer by referring to the alignment mark with the sharp contrast. Hence, the alignment performance between the exposure tool and the wafer is improved.

Moreover, in another embodiment, each of the distances d1 and d2 can be, for example but not limited to, about 2.5~3.5 times of the thickness of the device spacer 216 in the device region 212 and the pitch d3 of the second elements 208 embedded in the first element 206 is preferred to be about 2.5~5 times of the pitch d5 of the device array formed from device elements 214. Therefore, the total surface area of the first element is about 20%~60% of a total surface area of the sub-mark. Similar to the previous embodiment, this kind of structure arrangement provides a sharp contrast between the sub-mark and the background material layer 203. Therefore, the alignment performance between the exposure tool used in the later performed photolithography process and the wafer is improved.

Figure 3:
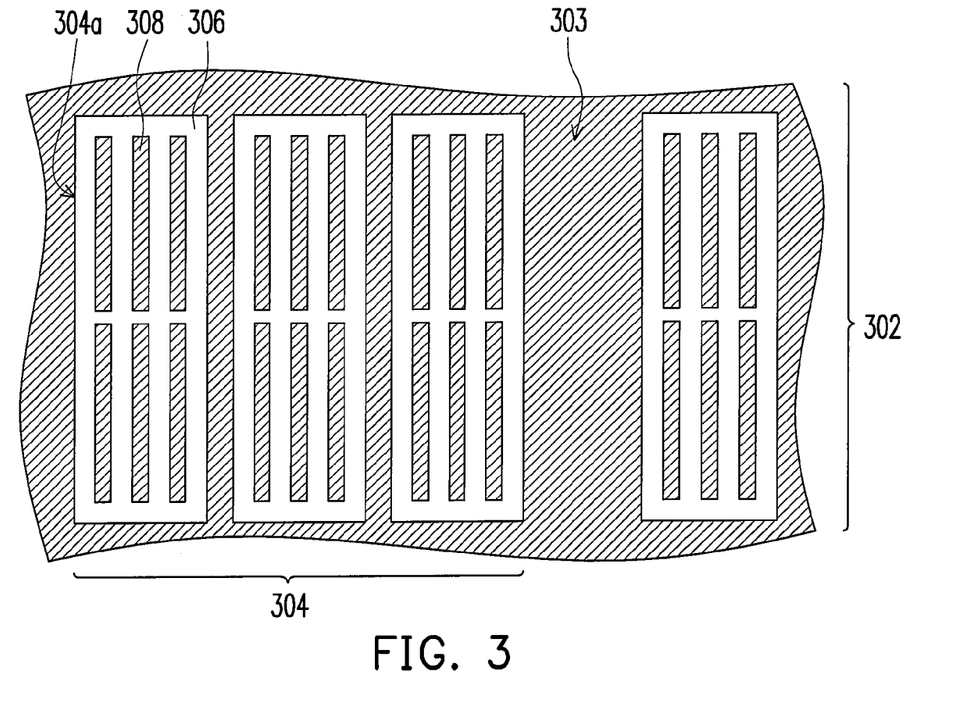
FIG. 3 is a top view schematically illustrating an alignment mark according to another embodiment of the present invention.

In the previous embodiment of the present invention shown in FIG. 2A, for each sub-mark 204a, the shape of each second element 208 is rectangular and the major axis of each second element 208 is perpendicular to the major axis of the first element 206. However, the type of the sub-mark of the present invention is not limited to the aforementioned description. FIG. 3 is a top view schematically illustrating an alignment mark according to another embodiment of the present invention. As shown in FIG. 3, in the alignment region 302, each sub-mark 304a of the alignment mark 304 has several second elements 308 enclosed by the first element 306. It should be noticed that the major axis of each second element 308 is parallel to the major axis of the first element 306 and the total surface area of the first element 306 is about 20%~60% of the that of the sub-mark 304a for each sub-mark 304a. Also, the strip-type second elements 308 are rectangular. Nevertheless, the shape of each second element 308 is not limited to be rectangular as long as the total surface of the first element is about 20%~60% of that of single sub-mark.

Figure 4:
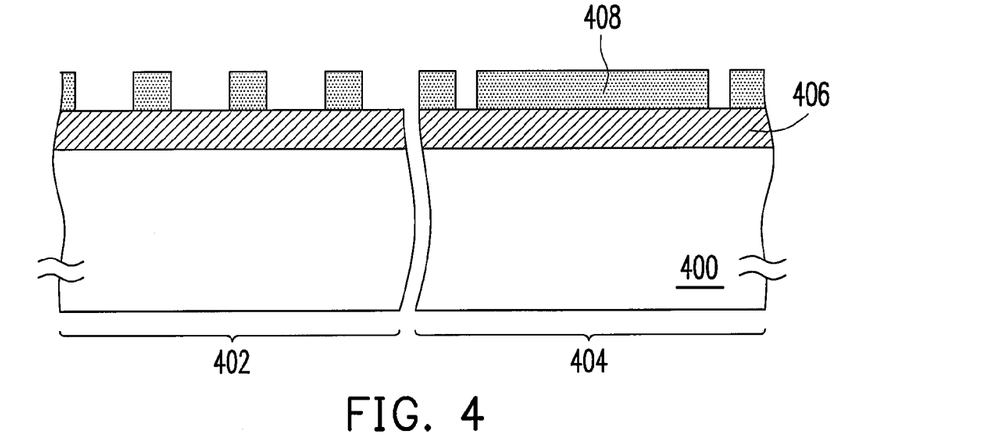
FIGS. 4 to 7 are cross-sectional views illustrating a method for forming an alignment mark according to one embodiment of the present invention.

FIGS. 4 to 7 are cross-sectional views illustrating a method for forming an alignment mark according to one embodiment of the present invention. In order to simplify the complexity of the drawings, the alignment region shown in FIGS. 4 to 7 only has one sub-mark. As shown in FIG. 4, a wafer 400 having at least one device region 402 and at least one alignment region 404 is provided. A plurality of inter connection layers (not shown) is formed on the wafer 400. A first material layer 406 is formed over the wafer 400. The material layer 406 can be, for example but not limited to, made of polysilicon or other material for forming a conductive device such as gate. A patterned photoresist layer 408 is formed on the first material layer 406.

Figure 5:
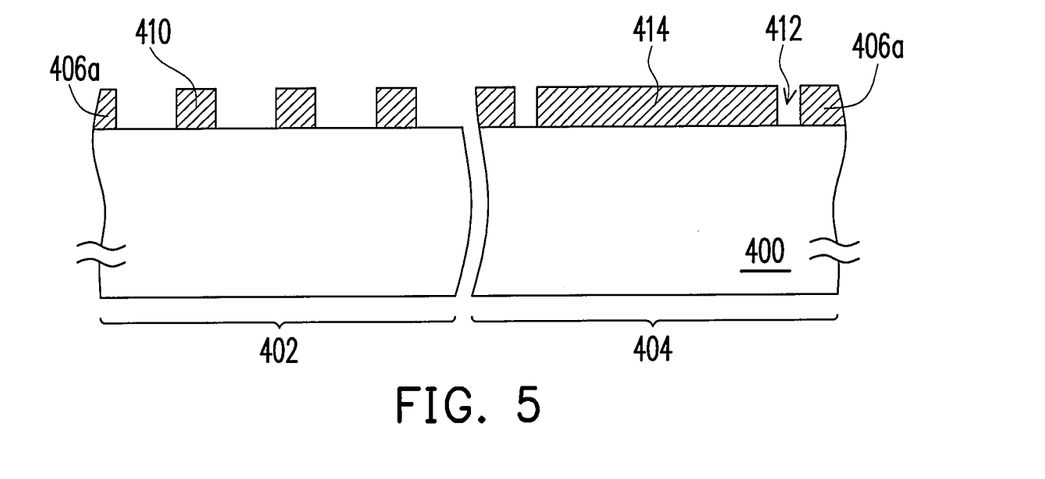
Figure 5A:
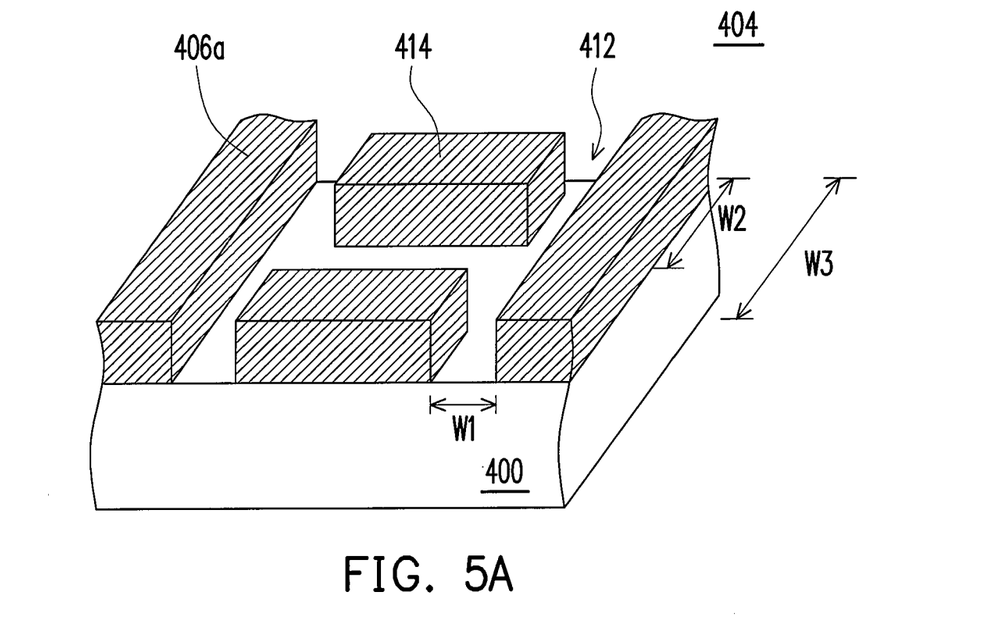
FIG. 5A is a three-dimensional diagram of the alignment region in FIG. 5.

FIG. 5A is a three-dimensional diagram of the alignment region in FIG. 5. As shown in FIG. 5 together with FIG. 5A, a photolithography process is performed to transfer the pattern of the patterned photoresist layer 408 into the first material layer 406 so that the first material layer 406 is converted into a patterned first material layer 406a. More specifically, a portion of the first material layer 406 in the device region 402 is transformed into device elements 410 and several trench patterns 412 are formed in a portion of the first material layer 406 in the alignment region 404. Each trench pattern 412 encloses several island elements 414 made of the first material layer 406. Also, the device elements 410, in the present embodiment, can be, for example but not limited to, gate strips. In addition, the gate strips in the present embodiment together form a device array.

Figure 6:
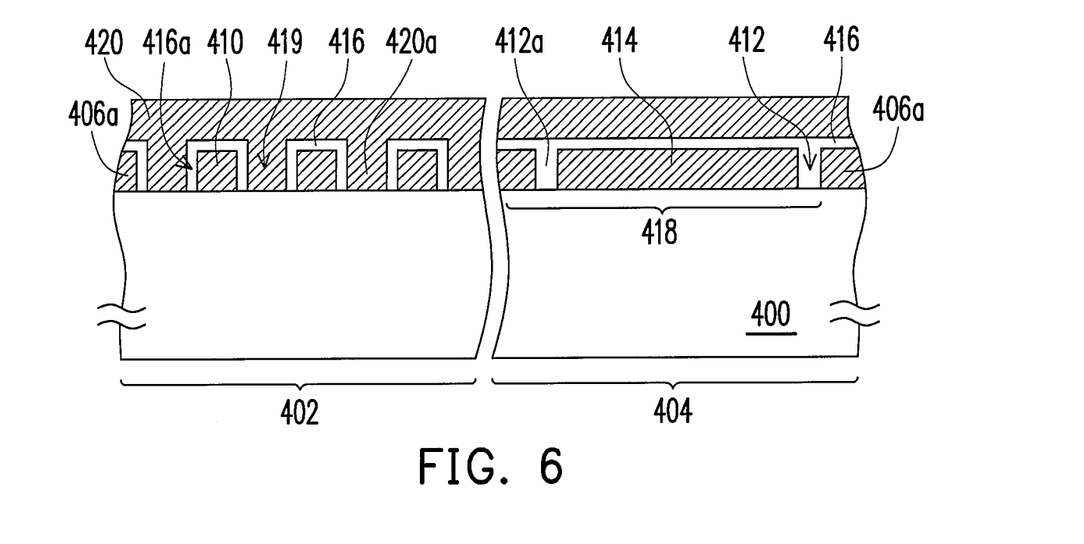
Figure 6A:
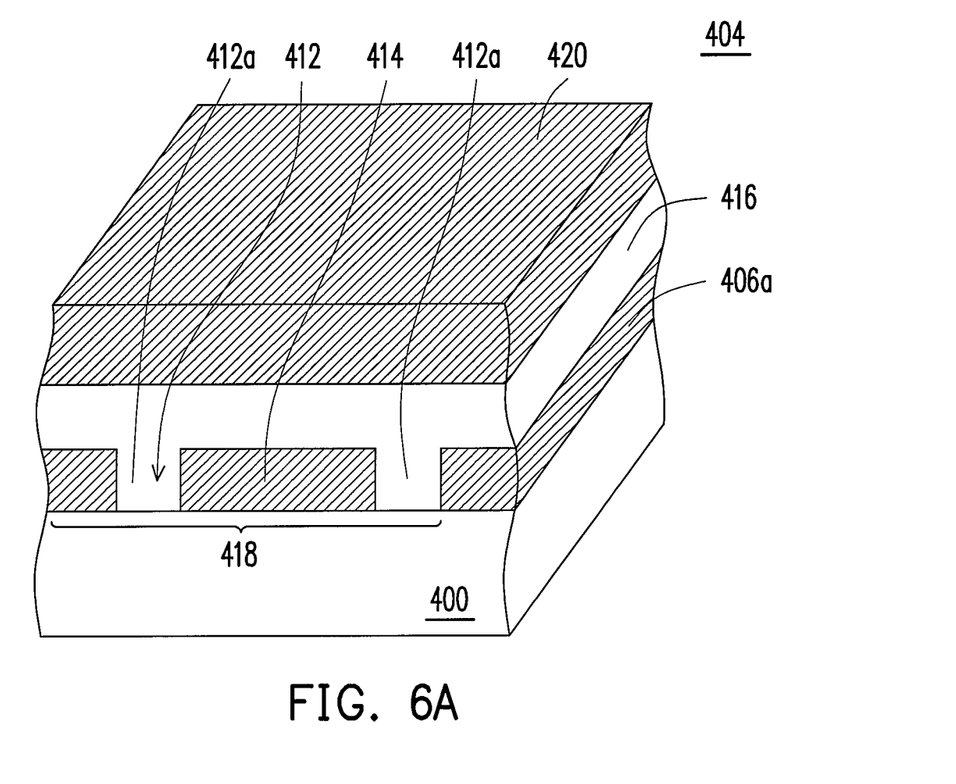
FIG. 6A is a three-dimensional diagram of the alignment region in FIG. 6.

FIG. 6A is a three-dimensional diagram of the alignment region in FIG. 6. As shown in FIG. 6 together with FIG. 6A, a second material layer 416 is formed over the first material layer 406a so that a spacer 416a is formed on the sidewall of each of the device elements 410 and fill the trench patterns 412. Thus, the filled trench patterns 412a and the island elements 414 are together defined as an alignment mark and each of the filled trench pattern 412a and the island elements 414 enclosed therein are defined as a sub-mark 418 of the alignment mark. The material of the second material layer 416 can be silicon oxide, silicon nitride, silicon oxynitride or other insulating material which is proper for forming a device spacer on the sidewall of the device. Furthermore, if the material of the second material layer 416 is silicon oxide, the method for forming the second material layer 416 can be an oxidation process for directly partially oxidizing the patterned first material layer 406a.

Still referring to FIG. 6 together with FIG. 6A, a third material layer 420 is formed over the wafer 400 so that gaps 419 between the device elements 410 in the device region 402 are filled. The third material layer 420 can be made of the material as same as the material of the first material layer 406 (shown in FIG. 4). That is, the third material layer 420 can be, for example but not limited to, made of polysilicon or other conductive material. The portions of the third material layer 420 fills into gaps 419 between the device elements 410 are defined as device elements 420a. Preferably, the size of each device elements 420a is as same as the size of each device elements 410. Thus, as same as the device elements 410, the device elements 420a can be, for example but not limited to, gate strips. Therefore, the device elements 410 and 420a together form the device array.

Figure 7:
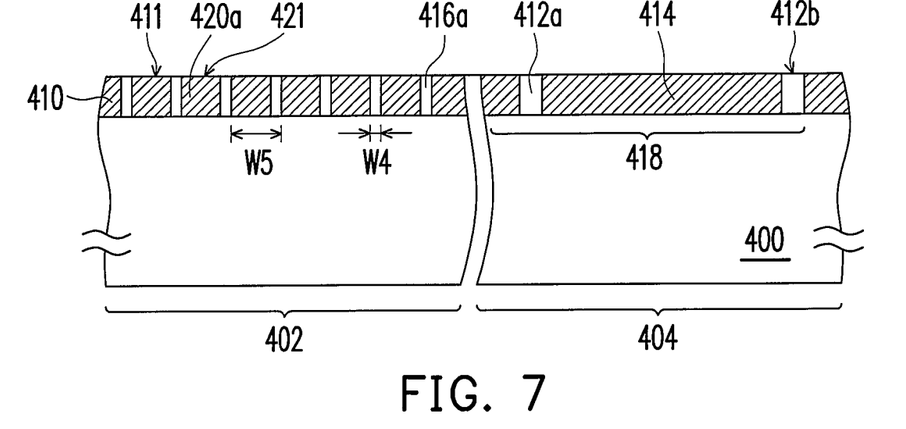
Figure 7A:
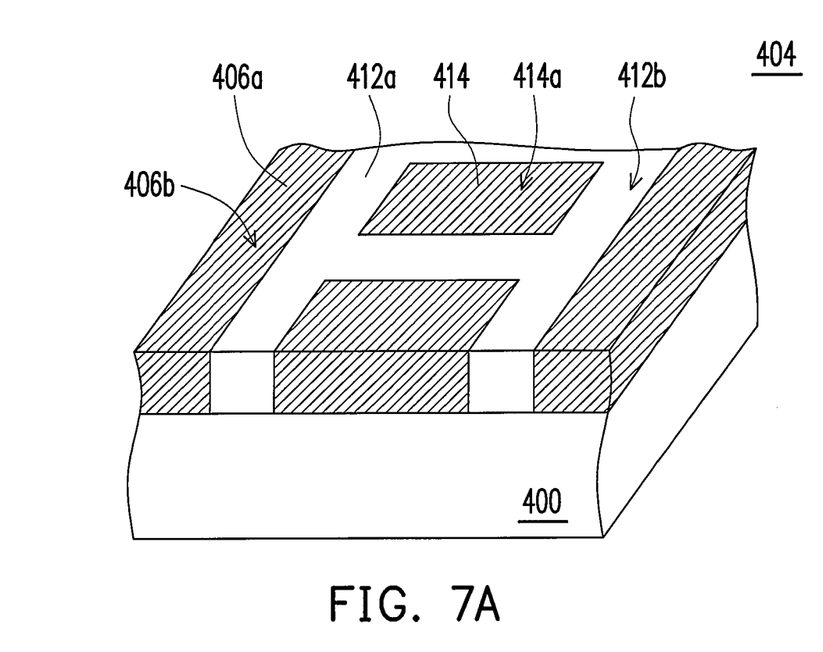
FIG. 7A is a three-dimensional diagram of the alignment region in FIG. 7.

FIG. 7A is a three-dimensional diagram of the alignment region in FIG. 7. As shown in FIG. 7 and FIG. 7A, a planarization process is performed so that the top surfaces 411 and 421 of each of the device elements 410 and 420a in the device region 406 is exposed. Meanwhile, the top surface 412b of a portion of the second material layer 416 in the trench pattern 412 is exposed and the top surface 406b of a portion of the first material layer 406a in the alignment region 404 is exposed as well. That is, in the alignment region 404, for each sub-mark 418, after the planarization process, the top surface 414a of each of the island elements 414 is exposed and the top surface 412b of the portion of the second material layer 416 shown in FIG. 6 and filling trench pattern 412 is also exposed. The planarization process can be, for example but not limited to, a chemical mechanical polishing process.

It should be noticed that the shortest distance w1 (shown in FIG. 5A) between each island element 414 and the outer edge of the trench pattern 412 can be, for example but not limited to, about 1~2 times of the thickness w4 (shown in FIG. 7) of the spacer 416a. Furthermore, the distance w2 (shown in FIG. 5A) between the island elements 414 is about 1~2 times of a thickness of the spacer 416a. When each of the distances w1 and w2 is about 1~2 times of the thickness of the spacer 416a in the device region 402, the pitch w3 (shown in FIG. 5A) of the island elements embedded in the filled trench pattern 412a is about 2~4 times of the pitch w5 (shown in FIG. 7) of the device elements 410 and 420a. Since each of the distances w1 and w2 is about 1~2 times of the thickness of the spacer 416a in the alignment region 404, the trench pattern 412 can be easily fully filled with the material for forming the filled trench pattern 412a Also, for each sub-mark 418, the total surface area of the filled trench pattern 412a is about 20%~60% of a total surface area of the sub-mark 418. Thus, the image contrast between the sub-mark 418 and the background, which is the first material layer 406a in the alignment region 404, is sharp. Thus, during the later performed photolithography process, the exposure tool can easily position the wafer by referring to the alignment mark with the sharp contrast. Hence, the alignment performance between the exposure tool and the wafer is improved.

Moreover, in another embodiment, each of the distances w1 and w2 can be, for example but not limited to, about 2.5~3.5 times of the thickness of the spacer 416a in the device region 402 and the pitch w3 of the island element 414 embedded in the filled trench pattern 412a is preferred to be about 2.5~5 times of the pitch w5 of the device array formed from device elements 410 and 420a. Although, in the aforementioned structure arrangement, the distance w1 and w2 is about 2.5~3.5 times of the thickness of the spacer 416a and the trench pattern 412 will not be totally filled with the material for forming the spacer 416a at the time the spacer 416a is formed, the total surface area of the filled trench pattern 412a is still about 20%~60% of a total surface area of single sub-mark 418. Similar to the previous embodiment, this kind of alignment mark structure arrangement provides a sharp contrast between the sub-mark and the background, the first material layer 406a. Therefore, the alignment performance between the exposure tool used in the later performed photolithography process and the wafer is improved.

In the previous embodiment of the present invention shown in FIG. 7A, for each sub-mark 418, the shape of each island element 414 is rectangular and the major axis of each island element 414 is perpendicular to the major axis of the filled trench pattern 412a. However, the type and the arrangement of the sub-mark of the present invention are not limited to the aforementioned description. As mentioned previously, the island element can be a polygon and the major axis of each island element can be varied as long as the total surface of the first element is about 20%~60% of that of single sub-mark. Therefore, the image contrast between alignment mark composed of the sub-marks and the background, the first material layer, is sharp. Thus, by referring to the alignment mark, the wafer can be precisely positioned and the alignment between the wafer and the exposure tool can be improved. By using the conventional alignment mark shown in FIG. 1, the image contrast is poor even before the photoresist layer is formed over the wafer for further defining the device elements in the device region of the wafer. In order to improve the alignment accuracy, it is necessary to perform additional process steps to enhance the image of the alignment mark. Thus, the procedure of the semiconductor process for using the conventional alignment mark is complex. Nevertheless, the alignment mark according to the present invention provides a relatively better image contrast so that the procedure of the semiconductor process using this alignment mark is simplified without performing extra process steps. Hence, the cost of the semiconductor process with the use of the alignment mark according to the present invention is decreased.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An alignment mark in an alignment region of a wafer, comprising:
   a plurality of sub-mark strips parallel to each other, wherein each of the sub-mark strips comprises:
   a first element disposed on the wafer and constructed as a shape of each of the sub-mark strips; and
   a plurality of second elements disposed on the wafer and distributed along an extending direction of the sub-marks strips,
   wherein the first element surrounds the second elements,
   wherein a first material of the first element comprises a material selected from the group consisting of silicon oxide, silicon nitride, silicon oxynitride; and a second material of the second elements comprises polysilicon.

2. The alignment mark as recited in claim 1, wherein a distance between the second elements is about 1~2 times of a thickness of a sidewall spacer.

3. The alignment mark as recited in claim 2, wherein a pitch of the second elements disposed in the first element is about 2~4 times of an array pitch.

4. The alignment mark as recited in claim 1, wherein a distance between the second elements is about 2.5~3.5 times of a thickness of a sidewall spacer.

5. The alignment mark as recited in claim 4, wherein a pitch of the second elements embedded in the first element is about 2.5~5 times of an array pitch.

6. The alignment mark as recited in claim 1, wherein, for each sub-mark strip, a total surface area of the first element is 20%~60% of a total surface area of the sub-mark strip.

7. A photolithography process used to transfer patterns from a photo mask to a target material layer formed on a wafer, comprising:
   forming a photoresist layer on the wafer;
   illuminating the photoresist layer through the photo mask having circuit patterns;
   developing the photoresist layer to form a patterned photoresist layer; and
   etching a non-process layer by using the patterned photoresist layer as a mask,
   wherein during the photolithography process the wafer is positioned by aligning the alignment mark as claimed in claim 1.

\* \* \* \* \*